United States Patent
Ishikawa

(10) Patent No.: US 9,171,919 B2
(45) Date of Patent: *Oct. 27, 2015

(54) SEMICONDUCTOR ELEMENT, SEMICONDUCTOR DEVICE AND METHODS FOR MANUFACTURING THEREOF

(75) Inventor: Akira Ishikawa, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 116 days.

This patent is subject to a terminal disclaimer.

(21) Appl. No.: 13/484,301

(22) Filed: May 31, 2012

(65) Prior Publication Data

US 2012/0238085 A1   Sep. 20, 2012

Related U.S. Application Data

(62) Division of application No. 11/822,775, filed on Jul. 10, 2007, now Pat. No. 8,198,680, which is a division of application No. 10/827,534, filed on Apr. 20, 2004, now Pat. No. 7,247,562.

(30) Foreign Application Priority Data

Apr. 23, 2003   (JP) .................................. 2003-118731

(51) Int. Cl.
*H01L 21/3205* (2006.01)
*H01L 21/4763* (2006.01)
(Continued)

(52) U.S. Cl.
CPC .... *H01L 29/41733* (2013.01); *H01L 29/66757* (2013.01); *H01L 29/78621* (2013.01); *H01L 29/78675* (2013.01); *H01L 21/84* (2013.01); *H01L 27/1203* (2013.01)

(58) Field of Classification Search
CPC .................. H01L 29/41733; H01L 29/78621; H01L 29/78675; H01L 29/66757; H01L 27/1203; H01L 21/84
See application file for complete search history.

(56) References Cited

U.S. PATENT DOCUMENTS 2,543,046 A    2/1951 Murray
2,735,763 A    2/1956 Heath
(Continued)

FOREIGN PATENT DOCUMENTS

JP    07-122737 A    5/1995
JP    08-064827      3/1996
(Continued)

OTHER PUBLICATIONS

Badith El-Karel, "Introduction to VLSI Silicon Devices, Physics, Technology and Charctcrization" 1986, Kluwer Adadcmic Press pp. 66-67.

(Continued)

*Primary Examiner* — Jarrett Stark
(74) *Attorney, Agent, or Firm* — Nixon Peabody LLP; Jeffrey L. Costellia

(57) ABSTRACT

The present invention provides a method of manufacturing a semiconductor element having a miniaturized structure and a semiconductor device in which the semiconductor element having a miniaturized structure is integrated highly, by overcoming reduction of the yield caused by alignment accuracy, accuracy of a processing technique by reduced projection exposure, a finished dimension of a resist mask, an etching technique and the like. An insulating film covering a gate electrode is formed, and a source region and a drain region are exposed, a conductive film is formed thereover, a resist having a different film thickness is formed by applying the resist over the conductive film, the entire surface of the resist is exposed to light and developed, or the entire surface of the resist is etched to form a resist mask, and the conductive film is etched by using the resist mask to form a source and drain electrode.

16 Claims, 8 Drawing Sheets

(51) Int. Cl.
*H01L 29/417* (2006.01)
*H01L 29/66* (2006.01)
*H01L 29/786* (2006.01)
H01L 21/84 (2006.01)
H01L 27/12 (2006.01)

(56) References Cited

U.S. PATENT DOCUMENTS

| | | |
|---|---|---|
| 2,873,189 A | 2/1959 | Evans et al. |
| 2,958,928 A | 11/1960 | Bain, Jr. et al. |
| 2,967,766 A | 1/1961 | Wetmore et al. |
| 2,968,555 A | 1/1961 | Bendler et al. |
| 2,976,188 A | 3/1961 | Kohl |
| 2,982,002 A | 5/1961 | Shockley |
| 2,983,633 A | 5/1961 | De Bernardi et al. |
| 2,994,121 A | 8/1961 | Shockley |
| 3,189,973 A | 6/1965 | Edwards et al. |
| 5,289,030 A | 2/1994 | Yamazaki et al. |
| 5,292,675 A | 3/1994 | Codama |
| 5,403,762 A | 4/1995 | Takemura |
| 5,459,090 A | 10/1995 | Yamazaki et al. |
| 5,501,989 A | 3/1996 | Takayama et al. |
| 5,576,556 A | 11/1996 | Takemura et al. |
| 5,589,694 A | 12/1996 | Takayama et al. |
| 5,592,008 A * | 1/1997 | Yamazaki et al. ............ 257/347 |
| 5,627,384 A | 5/1997 | Teramoto et al. |
| 5,643,826 A | 7/1997 | Ohtani et al. |
| 5,744,822 A | 4/1998 | Takayama et al. |
| 5,814,529 A | 9/1998 | Zhang |
| 5,863,820 A | 1/1999 | Huang |
| 5,897,344 A | 4/1999 | Teramoto et al. |
| 5,923,962 A | 7/1999 | Ohtani et al. |
| 5,962,897 A | 10/1999 | Takemura et al. |
| 6,087,679 A | 7/2000 | Yamazaki et al. |
| 6,136,636 A * | 10/2000 | Wu ................................ 438/231 |
| 6,140,667 A | 10/2000 | Yamazaki et al. |
| 6,258,678 B1 | 7/2001 | Liaw |
| 6,285,042 B1 | 9/2001 | Ohtani et al. |
| 6,335,541 B1 | 1/2002 | Ohtani et al. |
| 6,455,875 B2 | 9/2002 | Takemura et al. |
| 6,490,021 B1 | 12/2002 | Koyama |
| 6,541,795 B2 | 4/2003 | Kusumoto et al. |
| 6,549,252 B1 | 4/2003 | Lee et al. |
| 6,614,376 B2 | 9/2003 | Tanaka et al. |
| 6,624,477 B1 | 9/2003 | Takemura et al. |
| 6,882,018 B2 | 4/2005 | Ohtani et al. |
| 2001/0052950 A1 | 12/2001 | Yamazaki et al. |
| 2002/0011627 A1 | 1/2002 | Takemura et al. |
| 2002/0192915 A1 | 12/2002 | Wada et al. |
| 2003/0006414 A1 | 1/2003 | Takemura et al. |
| 2004/0023448 A1 | 2/2004 | Fukunaga |
| 2004/0063270 A1 | 4/2004 | Ishikawa |
| 2005/0009252 A1 | 1/2005 | Yamazaki et al. |
| 2005/0017303 A1 | 1/2005 | Ishikawa |

FOREIGN PATENT DOCUMENTS

| | | |
|---|---|---|
| JP | 08-078329 | 3/1996 |
| JP | 10-112512 | 4/1998 |
| JP | 3030367 | 4/2000 |
| JP | 2001-044437 A | 2/2001 |
| JP | 3252990 | 2/2002 |
| JP | 3375681 | 2/2003 |

OTHER PUBLICATIONS

Chinese Office Action (Application No. 200910163535.X) Dated Aug. 1, 2014.

Chinese Office Action (Application No. 200910163535.X) Dated Feb. 6, 2015.

* cited by examiner

SEMICONDUCTOR ELEMENT, SEMICONDUCTOR DEVICE AND METHODS FOR MANUFACTURING THEREOF

BACKGROUND OF THE INVENTION

1. Field of the Invention

The present invention relates to a semiconductor element having a miniaturized structure, for example a transistor, particularly a field-effect type of transistor, typically a MOS (Metal Oxide Semiconductor) transistor (hereinafter, MOSFET) and a thin film transistor (TFT), and also relates to a method for manufacturing the same, and a method for manufacturing a semiconductor device comprising the semiconductor element having a miniaturized structure.

2. Description of the Related Art

In recent years, a demand for downsizing, lightweight, low-cost is increasing more and more in an electric appliance containing a semiconductor device (e.g., a video camera, a digital camera, a projector, a personal computer, a mobile computer, a mobile phone, and an electronic book). It is natural for users to demand for better performance if the electric appliance is downsized and lightened, and the better performance than that of current one is being demanded in the electric appliance. A function and the performance of the electric appliance depend on characteristics of LSI which constitutes a system and characteristics of a display device in a display portion of the electric appliance. Accordingly, research and development on miniaturization and high-integration concerning the semiconductor device such as LSI and on brightness and high-definition of a display device is being actively done. By improving the degree of the miniaturization and the integration, the more functions can be mounted on one chip, which permits the above-described demand for the downsizing, the lightweight and the high performance of the electric appliance to be satisfied. A high-definition image display can be realized by increasing the number of pixels in the display device.

For example, a system-on-chip is proposed, in which circuits such as an MPU, a memory, and an I/O interface constituting a system (function circuit) are mounted on one chip in monolithic and which can realize high speed, high reliability, and low electrical power consumption. Further, a system-on-panel that the above system (functional circuit) is formed by using TFTs and formed (mounted) on the same substrate as a display panel, is also proposed. Technology development of high-integration has been done in order to realize the purposes. It is necessary to manufacture a TFT having a high switching speed for the sake of manufacturing the above described system (function circuit) by using the TFTs. Accordingly, miniaturization of a TFT element as well as enhancing crystallinity of a semiconductor region of a TFT is required more and more, and an attempt to reduce a size of each part (a wiring width, a channel width, a diameter of a contact hole, and the like) of a semiconductor element is made.

It is not too much to say that a processing technique and an etching technique by alignment control and reduced projection exposure determine the miniaturization level for high-integration and miniaturization of the semiconductor device.

A manufacturing step of a semiconductor element, a TFT as a representative example, is shown in FIGS. 7A to 7C. A base film 702 is formed on a substrate 701, a semiconductor region 703 is formed thereon, and a gate insulating film 704 is formed thereover. Then, a conductive film is formed over the gate insulating film, and this conductive film is etched to form a gate electrode 705. After that, impurities are doped into the semiconductor region by using the gate electrode 705 as a mask, and activated to form a source region 703a, a drain region 703b, and a channel forming region 703c. An insulating film is formed thereover as an interlayer insulating film 706. Then, a resist (not shown) is applied, and the resist is exposed to light and developed to form resist masks 708a to 708c. Etching is performed by using the resist masks 708a to 708c as etching masks so as to form contact holes 707a and 707b to connect with the source region 703a and the drain region 703b of the semiconductor region.

A source electrode 709a and a drain electrode 709b are formed in the contact holes 707a and 707b to form a TFT as shown in FIG. 7B.

There is a problem that a gate electrode 715 and a source electrode 719a or a drain electrode 719b short-circuit, as shown in FIG. 7C, due to misalignment of a photomask when the resist masks 708a to 708c are formed, in a manufacturing step of a semiconductor element, particularly, a semiconductor element having a miniaturized structure. When the electrodes short-circuit, the semiconductor element can not operate normally, and thus, the yield of a semiconductor device having the semiconductor element decreases.

For the sake of avoiding this problem, when a contact hole is formed, it is necessary to precisely control alignment accuracy in a light-exposure step for forming a resist mask, accuracy of processing technique by reduced projection exposure, a finished dimension of a resist mask formed after developing of the resist, an etching amount of lateral direction when an interlayer insulating film is etched to form a contact hole, and the like, and therefore, this makes it extremely difficult to manufacture a semiconductor device.

When, as shown in FIG. 7B, when a semiconductor element, in particular, a TFT is designed, a margin "A" to assure a connection of the source region 703a and the drain region 703b, and the source electrode 709a and the drain electrode 709b is considered, and the size of the semiconductor region "B" is designed greater than a desired size (B-4A). Therefore, the area of the TFT increases, thereby inhibiting high-integration.

SUMMARY OF THE INVENTION

It is an object of the present invention to provide a method of manufacturing a semiconductor element having a miniaturized structure and a semiconductor device in which the semiconductor element having a miniaturized structure is integrated highly by overcoming reduction of the yield caused by alignment accuracy, accuracy of a processing technique by reduced projection exposure, a finished dimension of a resist mask, an etching technique and the like.

According to the present invention, an insulating film covering a side of a gate electrode is formed, a contact portion is formed outside of the insulating film, and a semiconductor element is formed, in the semiconductor element having a semiconductor region, a gate electrode, the gate insulating film, and the contact portion for connecting the semiconductor region to external wirings.

According to the present invention, an insulating film covering a gate electrode is formed, and a source region and a drain region are exposed, a conductive film is formed thereover, a resist having a different film thickness is formed by applying the resist over the conductive film, the entire surface of the resist is exposed to light and developed, or the entire surface of the resist is etched to form a resist mask, and the conductive film is etched by using the resist mask to form a source electrode and a drain electrode, in a method of manufacturing a semiconductor element having a miniaturized structure.

According to the present invention, it is possible to manufacture a semiconductor element having a miniaturized structure with the high yield, regardless of alignment accuracy of the photomask, accuracy of a processing technique by reduced projection exposure, since a base of resist has a convex shape and a resist is partially different in film thickness, and thus, a resist mask can be formed without the photomask.

According to the present invention, an insulating film covering a gate electrode of a semiconductor element is formed, and the gate electrode and a source and drain electrode are formed with the insulating film therebetween.

According to the present invention, a channel forming region of the semiconductor region is adjacent (close) to the contact portion, in the semiconductor element having the semiconductor region, the gate electrode, the gate insulating film, and the contact portion for connecting the semiconductor region to external wirings.

As the result thereof, the distance between the channel forming region and the contact portion becomes short, the resistance generated therebetween is reduced, electric charges in the channel forming region easily move, and high-speed operation of the semiconductor element can be obtained because the mobility is enhanced.

The present invention includes structures to be described hereinafter.

According to the present invention, a method for manufacturing a semiconductor element, comprises the steps of: forming a gate insulating film, a gate electrode, and an insulating film covering the gate electrode over a semiconductor region, forming a conductive film after exposing a part of the semiconductor region, forming a resist mask after applying a resist over the conductive film, etching a part of the conductive film by using the resist mask, and etching a part of the etched conductive film or a part of the etched conductive film and a part of the semiconductor region.

According to the present invention, a method for manufacturing a semiconductor element, comprises the steps of: forming a gate insulating film, a gate electrode, and an insulating film covering the gate electrode over a semiconductor region, forming a conductive film after exposing a part of the semiconductor region, etching a part of the conductive film or a part of the etched conductive film and a part of the semiconductor region, forming a resist mask after applying a resist over the conductive film, and etching a part of the conductive film by using the resist mask.

According to the present invention, a method for manufacturing a semiconductor element, comprises the steps of: forming a first insulating film, a first conductive film, and a second insulating film over a semiconductor region, forming a hard mask by etching the second insulating film, etching the first conductive film by using the hard mask as a mask to form a gate electrode, and then, forming a third insulating film, etching the third insulating film to form a sidewall, etching the first insulating film by using the sidewall and the hard mask as a mask to form a gate insulating film, at the same time, exposing a part of the semiconductor region, and then, forming a second conductive film, forming a resist mask after applying a resist over the second conductive film, etching a part of the second conductive film by using the resist mask as a mask, and etching a part of the etched second conductive film or a part of the etched second conductive film and a part of the semiconductor region to form a source and drain electrode.

According to the present invention, a method for manufacturing a semiconductor element, comprises the steps of: forming a first insulating film, a first conductive film, and a second insulating film over a semiconductor region, forming a hard mask by etching the second insulating film, forming a third insulating film after etching the first conductive film by using the hard mask as a mask to form a gate electrode, etching the third insulating film to form a sidewall, etching the first insulating film by using the sidewall and the hard mask as a mask to form a gate insulating film, at the same time, exposing a part of the semiconductor region, and then, forming a second conductive film, etching a part of the second conductive film or a part of the second conductive film and a part of the semiconductor region, forming a resist mask after applying a resist over the etched second conductive film, and etching a part of the second conductive film by using the resist mask as a mask to form a source and drain electrode.

The resist mask is formed by exposing an entire face of the resist to light an developing, or may be formed by etching an entire face of the resist, and exposing the second conductive film or a part of the second conductive film.

The semiconductor region is a semiconductor substrate or a semiconductor thin film. And the semiconductor substrate is a single crystal silicon substrate or a compound semiconductor substrate. And the semiconductor thin film is a crystalline silicon film as a representative example.

According to the present invention, a semiconductor element comprises: a semiconductor region having a source region, a drain region, and a channel forming region, a gate electrode, a gate insulating film, a contact portion for connecting the semiconductor region to a source and drain electrode, and an insulating film covering the gate electrode, wherein the channel forming region is adjacent to the contact portion.

According to the present invention, a semiconductor element comprises: a semiconductor region having a source region, a drain region, and a channel forming region, a gate electrode, a gate insulating film, a contact portion for connecting the semiconductor region to a source and drain electrode, and an insulating film covering the gate electrode, wherein the gate electrode and the source and gate electrode are formed with the insulating film covering the gate electrode therebetween.

The insulating film covering the gate electrode comprises an insulating film that is formed over the gate electrode and an insulating film that is formed in a side face of the gate electrode. And the insulating film that is formed over the gate electrode is a hard mask as a representative example thereof and the insulating film that is formed in a side face of the gate electrode is a sidewall as a representative example thereof.

The semiconductor region is a semiconductor substrate or a semiconductor thin film. And the semiconductor substrate is a single crystal silicon substrate or a compound semiconductor substrate. And the semiconductor thin film is a crystalline silicon film as a representative example thereof.

These and other objects, features and advantages of the present invention become more apparent upon reading of the following detailed description along with the accompanying drawings.

BRIEF DESCRIPTION OF THE DRAWINGS

In the accompanying drawings.

DETAILED DESCRIPTION OF THE INVENTION

Hereinafter, this embodiment mode of the present invention is described with reference to drawings. Note that the present invention can be implemented with various different modes, and it is to be understood that various changes and modifications will be apparent to those skilled in the art, unless such changes and modifications depart from the scope and purpose of the present invention. Therefore, the present invention should not be limited to this embodiment mode to be described hereinafter.

Embodiment Mode 1

FIGS. 1A to 1E each show a manufacturing step of a TFT that is one of representative examples of a semiconductor element. This embodiment mode is described with reference to FIGS. 1A to 1E.

Figure 1A:
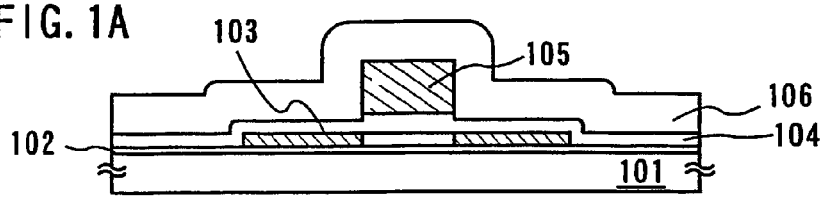
FIGS. 1A to 1E show a step of manufacturing a semiconductor element according to the present invention.

As shown in FIG. 1A, a base film 102 is formed on a substrate 101 for blocking impurities from the substrate. Then, after forming a semiconductor region 103 made of a semiconductor film having a desired shape, a first insulating film to serve as a gate insulating film, and a first conductive film to serve as a gate electrode are formed. Next, the first conductive film is etched into a desired shape to form a gate electrode 105. At this moment, a first insulating film 104 is etched partly and the film thickness thereof becomes thin. Then, a second insulating film 106 is formed over the entire surface of the substrate. After that, impurities are doped into the semiconductor region 103 by using the gate electrode as a mask, and an impurity region 103a is formed.

A glass substrate such as an alumino borosilicate glass, a barium borosilicate glass, or an aluminosilicate glass, a quartz substrate, a sapphire substrate or the like, each of which has a heat resistance to 500° C. or more, is used as the substrate 101. The semiconductor film is formed by a known technique such as a reduced pressure thermal CVD, a plasma CVD, a sputtering. A semiconductor material, e.g., silicon or an alloy containing mainly silicon can be used for the semiconductor film. The gate electrode may have a single layer structure or a multilayer structure. An element selected from tantalum (Ta), tungsten (W), titanium (Ti), molybdenum (Mo), aluminum (Al), copper (Cu), chromium (Cr), or niobium (Nb), an alloy material or compound material mainly containing the above element, or a silver-copper-palladium alloy (AgPdCu alloy) may be used for the material of the gate electrode.

Figure 1B:
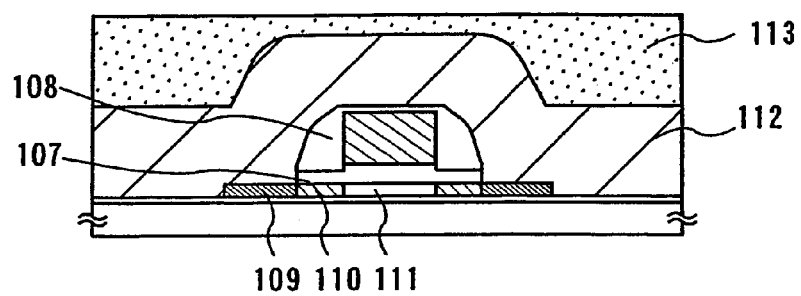

Next, as shown in FIG. 1B, the second insulating film is etched. By this step, an insulating film 108 covering the gate electrode is formed. Note that the insulating film 108 covering the gate electrode is formed to insulate a source electrode and a drain electrode from a gate electrode, which are formed later. Therefore, the insulating film 108 may be formed so that at least a side of the gate electrode is covered therewith.

An insulating film containing silicon as the main component can be employed as the second insulating film. The second insulating film is etched by performing anisotropic etching such as a reactive ion etching method (hereinafter, a RIE method), or an Electron Cyclotron Resonance method (hereinafter, an ECR method) to form a sidewall. Instead of this step, a resist mask is formed and the second insulating film is etched, and thus, an insulating film covering the gate electrode may be formed.

Subsequently, an impurity element imparting an n-type or p-type conductivity is doped into a semiconductor region by using the gate electrode 105 and the insulating film 108 covering the gate electrode, thereby forming a high concentration impurity region 109, a low concentration impurity region 110 and a channel forming region 111. Then, a heat treatment, intense light irradiation, or laser light irradiation may be conducted to activate the impurities that are added into the high concentration impurity region and the low concentration impurity region. And by removing the first insulating film over a source region and a drain region by wet-etching or dry-etching, the source region and the drain region are exposed to form a contact portion, and at the same time, a gate insulating film 107 is formed. Note that the high concentration impurity region 109 becomes a source region and a drain region.

A second conductive film 112 is formed over the entire surface of the substrate. At the time, the second conductive film 112 has also a convex shape, since the gate electrode 105 has a convex shape over the substrate.

In FIG. 1B, the second conductive film 112 has a single layer structure, but may have a multilayer structure. The second conductive film 112 is formed from an element selected from the group consisting of aluminum (Al), titanium (Ti), molybdenum (Mo), and tungsten (W), or an alloy material mainly containing these elements.

Next, a resist 113 is applied to the entire surface of the substrate. At this moment, the entire surface of the substrate becomes almost level, by applying the resist to the entire surface, although a base film of the resist is convex and concave. The resist that is formed over the gate electrode is thin in thickness and the resist of a region except the region over the gate electrode is thick in thickness.

Figure 1C:
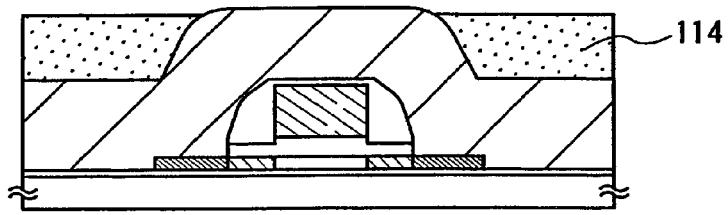

Next, as shown in FIG. 1C, a resist mask 114 is formed by exposing the resist to light and developing it, without a photomask.

Here, a light-exposure method used in the present invention so that a resist film is left selectively in a concave portion is described with reference to FIGS. 5A and 5B.

Figure 5A:
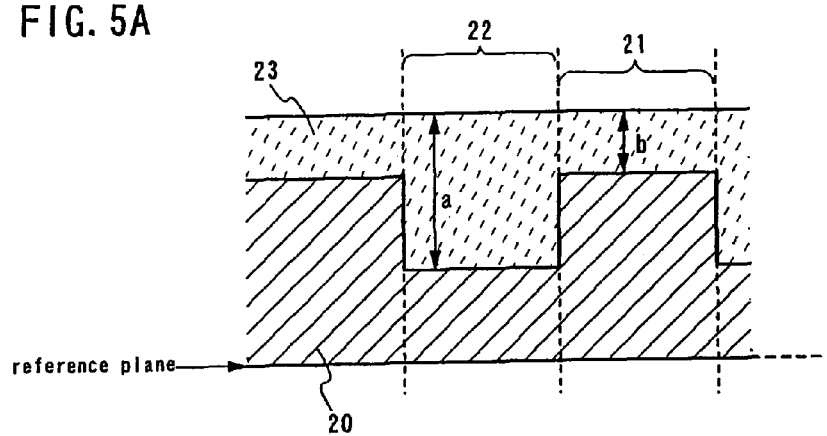
FIGS. 5A and 5B show a light-exposure method employed in the present invention.

FIG. 5A is a cross section view showing schematically an object 20 having a convex and concave shape. In FIG. 5A, in consideration of the height of the surface from a reference plane, a portion in which the object 20 has a convex shape is denoted by reference numeral 21 and a portion in which the object 20 has a concave shape is denoted by reference numeral 22. The object 20 is covered with a resist film 23.

The distance between the surface of the object 20 and a surface of the resist film 23 in a region 21 is "b" and the distance between the surface of the object 20 and a surface of the resist film 23 in a region 22 is "a".

Light-exposure is performed on the entire surface in such a light-exposure condition that the residual film rate of the region 21 is 0 percent and the residual film rate of the region 22 is about y1(=(a−b)/a×100) percent. A mask for forming an optical pattern such as reticle is not required for the light-exposure, and the entire surface is irradiated with light. Thus, a photomask is not needed.

Here, the residual film rate is expressed by a formula: the residual film rate (%)=a resist film thickness after developing/a resist film thickness after applying×100. In addition, a light-exposure amount [mJ/cm$^2$]=the intensity of irradiated light [mW/cm$^2$]×time of light-exposure [msec]. When the residual film rate is 0 percent, the lower limit of the light-exposure amount is expressed by E th. The residual film rate extremely depends upon film thickness of a resist film, quality of a film below the resist film, an applying condition and a development condition of the resist film, and thus, the E th also depends on the conditions.

Generally, as the film thickness of the resist is thicker, the E th has a tendency to increase (the tendency is referred to as a bulk effect). The E th changes also in accordance with the reflectance of the film below of the resist film, and the E th has a tendency to decrease, as the reflectance is higher. The residual film rate of a positive type resist film has a tendency to decrease, as the energy amount of light received by the resist, namely, light amount, is larger. In the light-exposure, the resist film receives both light that is emitted from a light-exposure apparatus and light that is reflected on the film below the resist film. Therefore, as the reflectance is higher, there is a tendency that the resist film receives more light and the E th decreases. The present invention actively utilizes the dependency on a resist film of the E th.

Figure 5B:
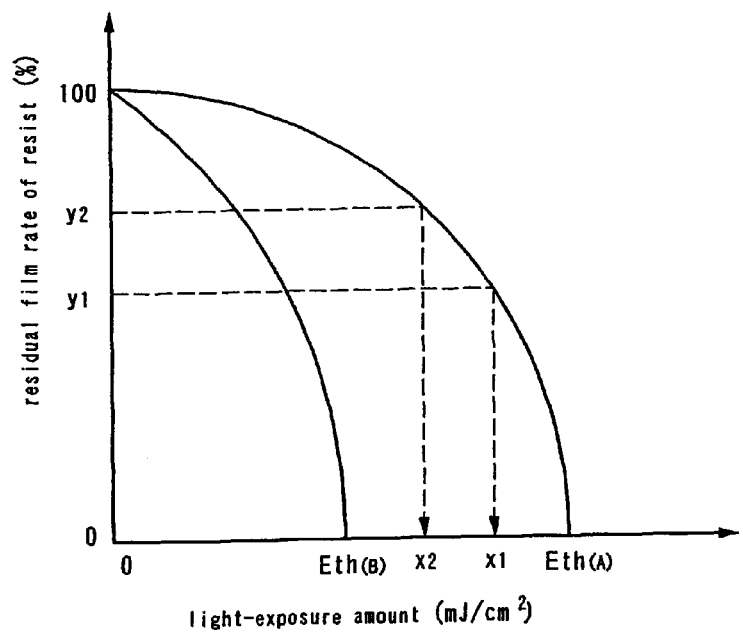

FIG. 5B schematically shows relationships between the light exposure amount and the residual film rate in the two different regions in a resist film thickness (the region 21 and the region 22). Because the resist film thickness is thicker in the region 22 than in the region 21, the E th of the region 22 (hereinafter, E th$_{(A)}$) is higher than that of the region 21 (hereinafter, E th$_{(B)}$). The residual film rate of the region 22 is preferably set to y1 percent or more, and thus, light irradiation may be performed with the light-exposure amount of x1 [mJ/cm$^2$] or less. The residual film rate of the region 21 is preferably set to 0 percent, and thus, light irradiation may be performed with the light-exposure amount of E th$_{(B)}$ or more. Accordingly, it is apparent that the light irradiation may be performed with the light-exposure amount of from at least E th$_{(B)}$ [mJ/cm$^2$] to at most x1 [mJ/cm$^2$].

As the difference between E th$_{(A)}$ and E th$_{(B)}$ is larger and the difference between x1 and x2 is larger, a margin for the light-exposure condition expands. The difference between the resist film thickness "a" in the region 22 and the resist film thickness "b" in the region 21 may be made large to increase the difference between E th$_{(A)}$ and E th$_{(B)}$. E th$_{(B)}$ become smaller by adjusting the resist film thickness in applying so that resist film thickness "b" in the region 21 is as thin as possible, and thus, the resist film in the region 21 is easy to remove. Therefore, the margin of the light-exposure condition can be ensured adequately by adjusting the film thickness of the resist film.

As described above, the residual film rate can be controlled in accordance with the light-exposure amount, and the residual film rate of resist can be adjusted in accordance with a shape of an object to be exposed to light even in the case of irradiating the entire surface with light. Note that it is necessary to examine the relationship between the light-exposure amount and the residual film rate of every object to be treated beforehand, since the relationship between the light-exposure amount and the residual film rate changes depending on property of resist (viscosity, or kinds of contained solvent or light absorbing agent), shape and material of an object to be applied with resist, or a bake condition in the case of applying and development. These steps may be performed by determining the conditions in the same way as light-exposure condition of conventional photolithography.

A negative type resist may be used to fill a concave portion formed in an opening portion, instead of using the positive type resist described above. In the case of using the negative type resist, a light-exposure step is not necessarily conducted, and a resist film may be left in the concave portion by adjusting development time or concentration of development solution. It should be noted that the resist film in the concave portion can be controlled to easily remain by locally heating only a lower portion of the resist film from under the object to be heated and changing its quality before development.

Figure 1D:
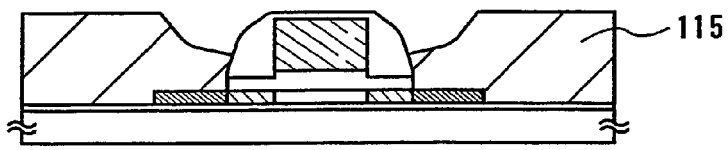

Next, as shown in FIG. 1D, a second conductive film 115 is divided by etching the second conductive film formed over the gate electrode by using the remained resist 114 as a mask.

Figure 1E:
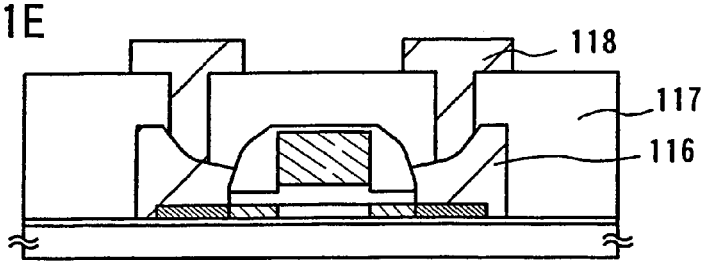

Then, as shown in FIG. 1E, an insulated second conductive film 115 is etched into a desired shape and a source electrode and drain electrode 116 is formed as well as insulating other TFTs. In this step, the area of a TFT can be reduced by etching a source and drain region as well as the second conductive film 115. Then, a third insulating film is formed over the substrate as an interlayer insulating film 117. A contact hole is formed to connect with the source and drain electrode 116, and a third conductive film to be connection wirings is formed. Thereafter, a resist mask having a desired pattern is formed over the third conductive film, and the conductive film is etched into a desired shape by using the mask to form a connection wiring 118.

A step shown in FIG. 1E (the step of etching the conductive film into a desired shape and insulating it from other TFTs) may be performed between the step of forming the conductive film 112 over the entire surface of the substrate and the step of applying the resist mask 113 over the entire surface of the substrate in FIG. 1B in this embodiment mode.

In the TFT formed in the embodiment mode, a resist mask having a desired shape can be formed without using a photomask, and a source electrode and a drain electrode can be formed by self-alignment. Thus, in a TFT having a miniaturized structure, short-circuit of a gate electrode and a source and drain electrode due to misalignment can be prevented, thereby manufacturing a TFT with the high yield.

The area of a TFT can be reduced, since it is not necessary to expand the area of the semiconductor region in consideration of a margin so as to ensure connection between the semiconductor region and the source and drain electrode.

Further, in a semiconductor element formed in the present invention, a gate electrode and a source and drain electrode are formed with an insulating film 108 covering the gate electrode therebetween. Namely, it is possible to closely form a channel forming region and a source and drain electrode under the gate electrode, and thus, to reduce the resistance therebetween. Therefore, a TFT that can operate with high-speed can be manufactured.

In this embodiment mode, a TFT is given as a representative example of a semiconductor element, but a FET (MOSFET) that is formed by using a silicon substrate or a SOI (Silicon On Insulator) substrate can be applied.

It is possible to increase the number of semiconductor elements mounted per unit area of one substrate, when a semiconductor device is manufactured by using a semiconductor element of the present invention. Thus, it is possible to manufacture semiconductor devices such as a scanning line driver circuit, a signal line driver circuit, a controller, a CPU, a converter of an audio processing circuit, a power supply circuit, a transmit and receive circuit, a memory, an amplifier of an audio processing circuit, or the like in a pixel portion in which the integration degree is enhanced. A system-on-chip or a system panel in which the above devices are formed on the same substrate can be manufactured.

Embodiment Mode 2

In this embodiment mode, a manufacturing method using another step is described, in forming a resist mask used for forming a source and drain electrode. Note that the same portions as those in Embodiment 1 are shown by the same reference numerals and further description thereof is omitted.

Figure 2A:
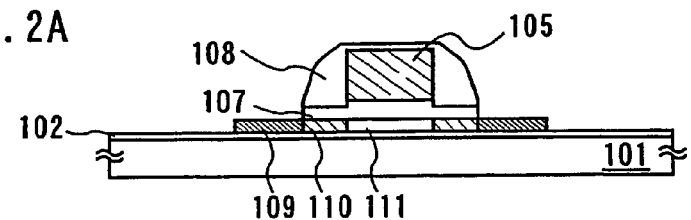
FIGS. 2A to 2E show a step of manufacturing a semiconductor element according to the present invention.

The state shown in FIG. 2A is obtained, as in Embodiment 1. Specifically, a base film 102, a semiconductor region including a high concentration impurity region 109, a low concentration impurity region 110 and a channel forming region 111, a gate insulating film 107, a gate electrode 105, an insulating film 108 covering at least a side of the gate electrode are formed over a substrate 101.

Figure 2B:
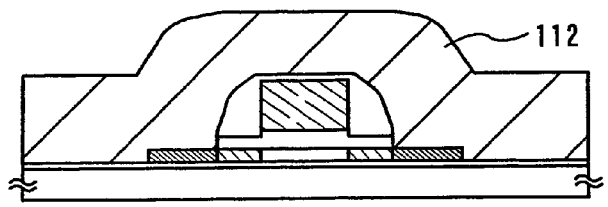

As shown in FIG. 2B, a conductive film 112 is formed over the entire surface of the substrate. At the time, the conductive film 112 has also a convex shape, since the gate electrode 105 has a convex shape over the substrate.

Figure 2C:
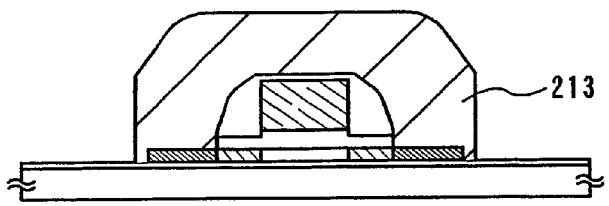

As shown in FIG. 2C, the conductive film is etched into a desired shape to form a conductive film 213 that is insulated every TFT.

Figure 2D:
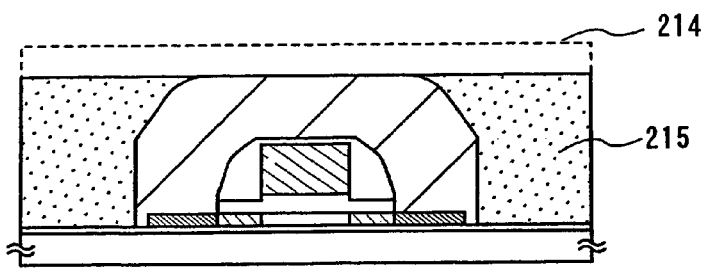

Next, as shown in FIG. 2D, a resist 214 is applied over the entire surface of the substrate. At this moment, the entire surface of the substrate becomes almost level, by applying the resist to the entire surface, although a base film of the resist is convex and concave.

The entire surface of the resist 214 is etched. The conductive film 213 is exposed by etching and removing the resist over the gate electrode. A resist 215 formed over a source region and a drain region partly remains. According to the above steps, the resist mask 215 can be formed without a photomask.

Figure 2E:
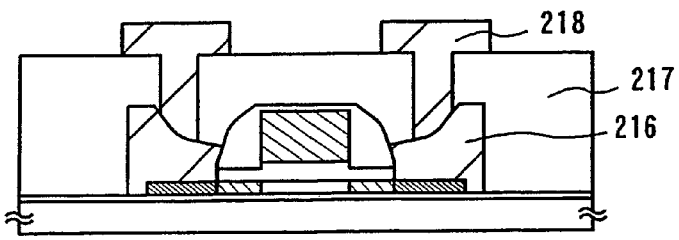

As shown in FIG. 2E, the conductive film 213 is etched to form a source and drain electrode 216 by using the remained resist 215 as a mask. An interlayer insulating film 217 is formed over the substrate. A contact hole is formed to connect with the source and drain electrode 216 and a conductive film to be a connection wiring is formed. Thereafter, a resist mask having a desired pattern is formed over the conductive film, and the conductive film is etched into a desired shape by using the mask to form a connection wiring 218.

In the TFT formed in the embodiment mode, a resist mask having a desired shape can be formed without using a photomask, and a source electrode and a drain electrode can be formed by self-alignment. Thus, in a TFT having a miniaturized structure, short-circuit of a gate electrode and a source and drain electrode due to misalignment can be prevented to manufacture a TFT with the high yield.

The area of a TFT can be reduced, since it is not necessary to expand the area of the semiconductor region in consideration of a margin so as to ensure a connection between the semiconductor region and the source and drain electrode.

Further, in a semiconductor element formed in the present invention, a gate electrode and a source and drain electrode are formed with an insulating film 108 covering the gate electrode therebetween. Namely, it is possible to closely form a channel forming region and a source and drain electrode, and thus, to reduce the resistance therebetween. Therefore, a TFT that can operate with high-speed can be manufactured.

In this embodiment mode, a TFT is given as a representative example of a semiconductor element, but a FET (MOSFET) that is formed by using a silicon substrate can be applied.

It is possible to increase the number of semiconductor elements mounted per unit area of one substrate, when a semiconductor device is manufactured by using a semiconductor element of the present invention. Thus, it is possible to manufacture semiconductor devices such as a scanning line driver circuit, a signal line driver circuit, a controller, a CPU, a converter of an audio processing circuit, a power supply circuit, a transmit and receive circuit, a memory, and an amplifier of an audio processing circuit in a pixel portion in which the integration degree is enhanced. A system-on-chip or a system panel in which the above devices are formed on the same substrate can be manufactured.

EMBODIMENTS

Embodiment 1

In this embodiment, a step of manufacturing a semiconductor element over a substrate having an insulating surface, for example a glass substrate in this embodiment, is described with reference to FIGS. 3A to 3E and FIGS. 4A to 4D, according to the present invention.

Figure 3A:
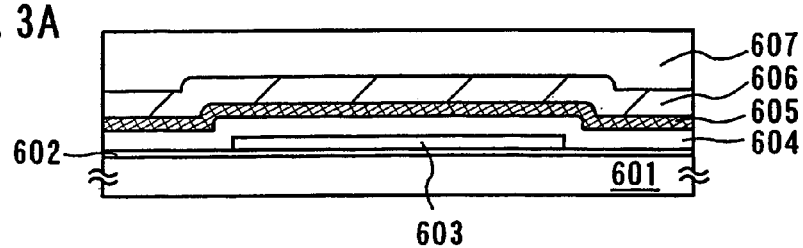
FIGS. 3A to 3E show a step of manufacturing a semiconductor element according to the present invention.

As shown in FIG. 3A, a base insulating film 602 is formed over the glass substrate (a first substrate 601). In this embodiment, the base insulating film has a two-layer structure in which a first silicon oxynitride film is formed to be from 50 nm to 100 nm thick by using $SiH_4$, $NH_3$, and $N_2O$ as reactive gases, and a second silicon oxynitride film is formed to be from 100 nm to 150 nm thick by using $SiH_4$ and $N_2O$ as reactive gases in laminate.

An amorphous silicon film (54 nm in thickness) is laminated by a known technique such as plasma CVD, reduced pressure CVD, or sputtering.

The amorphous silicon film is crystallized by employing a known technique described in Japanese Patent Laid-Open No. H8-78329. By the technique explained in the gazette, a metal element that promotes crystallization is selectively doped into the amorphous silicon film and a heat treatment is performed. Silicide is formed in a part of the amorphous silicon film that is in contact with the metal element that promotes crystallization of the semiconductor, and thus, the crystallization progresses with the silicide as a core. Here, a heat treatment for dehydrogenation (at 450° C., for one hour) is performed, and sequentially, a heat treatment for crystallization (at temperatures from 550° C. to 650° C., for from 4 to 24 hours) is performed.

Thereafter, a metal element in a crystalline silicon film is removed or the concentration is reduced by gettering the metal element from the crystalline silicon film. The gettering may be performed by either of the following methods: a method in which a gettering site is formed by doping phosphorus, a rare gas (generally, argon), or the like into a part of the crystalline silicon film and then, a heat treatment is performed so that the metal element is segregated; or a method in which an amorphous silicon film or a crystalline silicon film each including phosphorus, a rare gas, or the like is laminated over the crystalline silicon film interposing an oxide film therebetween to serve as a gettering site, and a heat treatment is performed so that the metal element is moved to the gettering site. It is preferable that the concentration of the impurity element, that is, a metal element, in the crystalline silicon film after gettering be $1 \times 10^{17}/cm^3$ or less (SIMS (secondary ion mass spectrometry) measurement limit or less), and further preferably, $5 \times 10^{16}/cm^3$ or less when measured by ICP-MS (inductively coupled plasma mass spectrometry).

Next, the crystalline silicon film is preferably irradiated with laser light for repairing defects left in crystal grains and increasing the degree of crystallinity (the proportion of crystalline component in the volume of a whole film).

The crystalline silicon film is etched to form a crystalline silicon film 603 having a desired shape. Then, after the surface of the silicon film is washed with an etchant including hydrofluoric acid, a first insulating film 604 mainly containing silicon that is to be a gate insulating film is formed. The surface of the first insulating film 604 is washed, and then, a first conductive film 605, a second conductive film 606 and a second insulating film 607 (from 500 nm to 1000 nm in thickness) are sequentially formed. In this embodiment, a tantalum nitride film is formed as the first conductive film, a tungsten film is formed as the second conductive film and a silicon nitride oxide film is formed as the second insulating film.

Figure 3B:
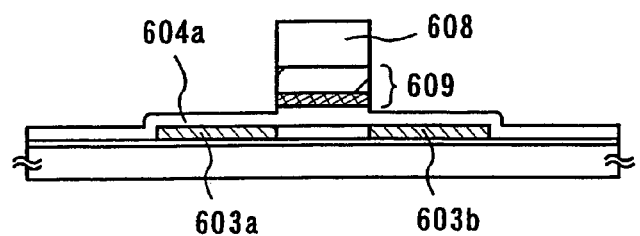

Next, the second insulating film 607 is etched to have the almost same width as the gate electrode width to form a hard mask 608, as shown in FIG. 3B. After that, the second conductive film (tungsten film), and the first conductive film (tantalum nitride film) are etched to form a gate electrode 609 of about 1 µm long by using the hard mask 608. At the time, the first insulating film 604 to be a gate insulating film is slightly etched (604a).

An impurity element (such as P, As) imparting n-type or an impurity element (such as B) imparting p-type is added into the crystalline silicon film by using the hard mask 608 and the gate electrode 69 as a mask, thereby forming impurity regions 603a and 603b. Here, phosphorus or boron is doped appropriately.

Figure 3C:
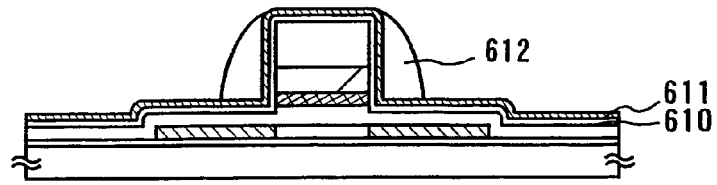

Next, as shown in FIG. 3C, a third insulating film and a fourth insulating film are formed. A silicon oxynitride film 610 (from 20 nm to 50 nm in thickness) is formed as the third insulating film, and a silicon nitride film 611 (from 50 nm to 100 nm in thickness) is formed as the fourth insulating film in this embodiment. It should be noted that the silicon nitride film 611 is preferably a film having selective ratio of the etching rate with respect to a fifth insulating film to be formed later, since it is formed as an etching stopper for the fifth insulating film. The silicon oxynitride film 610 is provided in order to separate the silicon nitride film from the crystalline silicon film. This is because it prevents deterioration of electric properties of a TFT due to a contact of the silicon nitride film and the crystalline silicon. Note that the silicon nitride film 611 and the silicon oxynitride film 610 are not necessarily formed, depending on etching conditions of the fifth insulating film to be formed later.

After a silicon oxynitride film (from 500 nm to 1000 nm in thickness) as the fifth insulating film is formed over the entire surface of the substrate, the silicon oxynitride film is anisotropically etched by a RIE method, an ECR method, or the like to form a sidewall 612. Note that load of an etching step is less, because the film thickness of the gate electrode is thin in this embodiment. Further, when the height of a gate electrode is low, a sidewall is formed with less control. However, in this embodiment, the gate electrode 609 and the hard mask 608 are laminated and the sidewall is formed on the side thereof. Therefore, the sidewall can be formed with good control and in less load.

Figure 3D:
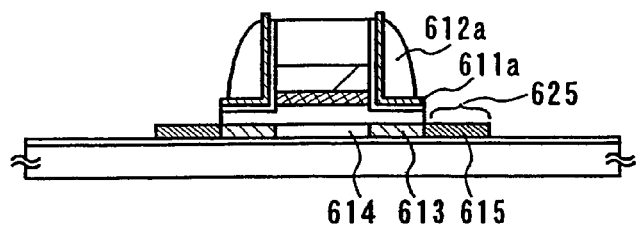

Next, as shown in FIG. 3D, the fourth insulating film (silicon nitride film) 611 is anisotropically etched. The silicon nitride film 611 of the region where the sidewall is not formed is etched, and thus, only a silicon nitride film 611a covered with the sidewall is left.

An impurity element (such as P, As) imparting n-type or an impurity element (such as B) imparting p-type is added into a crystalline silicon film by using the sidewall 612 and the silicon nitride film 611a that is etched as a mask, thereby forming a high concentration impurity region 615. Here, phosphorus or boron is doped appropriately. The region of the crystalline silicon film that is covered with the sidewall and the silicon nitride film is a low concentration impurity region 613 having a width of from 0.2 to 0.5 µm, preferably about 0.3 µm. The region of the crystalline silicon film that is covered with the gate electrode and the hard mask is a channel forming region 614. Then, a heat treatment, intense light irradiation, or laser light irradiation is performed in order to activate the added impurity element.

Although not shown, a contact portion for connecting with the gate electrode 609 is formed by etching a portion of the hard mask 608, in order that the gate electrode 609 is connected to an external wiring.

Then, the entire surface of the substrate is exposed to dry etching, and the silicon oxynitride film 610 covering the crystalline silicon film and an insulating film 604a that has been etched slightly are etched to expose a source region and a drain region, and thus, the contact portion 625 is formed. At this moment, the sidewall 612 is etched partly to be 612a.

Figure 3E:
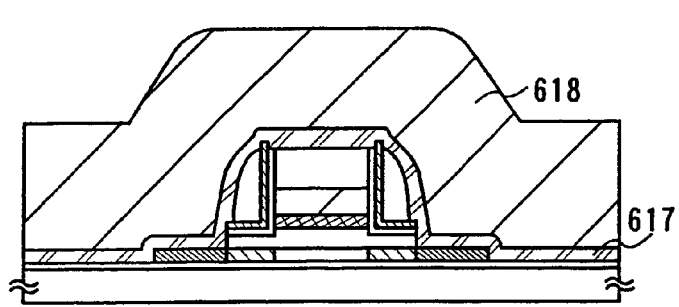

As shown in FIG. 3E, a third conductive film 617 and a fourth conductive film 618 are formed over the entire surface of the substrate. In this embodiment, after forming a tantalum nitride film (from 80 nm to 120 nm in thickness) as the third conductive film, an aluminum film (from 300 nm to 500 nm in thickness) is formed as the fourth conductive film.

Figure 4A:
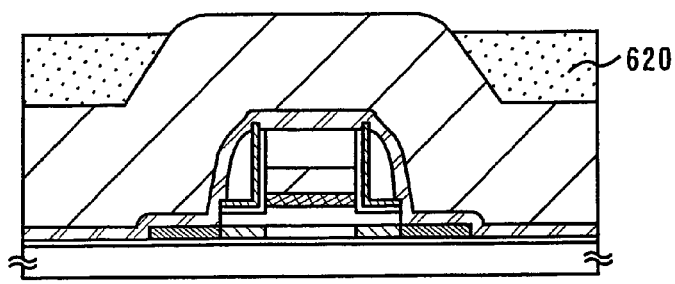
FIGS. 4A to 4E show a step of manufacturing a semiconductor element according to the present invention.

A resist is applied over the entire surface of the substrate. After that, a light-exposure is preformed under such light-exposure conditions that only resist (a convex portion) over the gate electrode is exposed to light, and then, is developed, as shown in Embodiment Mode 1. By such conditions, a resist 620 remains over a source and drain region 615 (a concave portion). After that, ashing may be performed to set the line width of the resist to an arbitrary value (FIG. 4A).

Figure 4B:
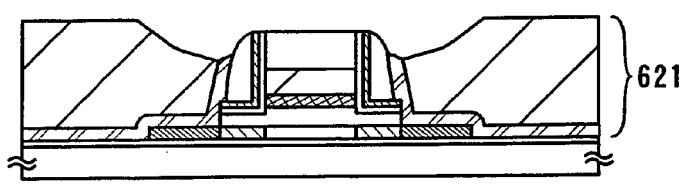

As shown in FIG. 4B, the third conductive film 618 and the fourth conductive film 617 are removed by wet-etching or dry-etching with a resist mask 620, thereby forming a conductive film 621 that is divided over the gate electrode.

Figure 4C:
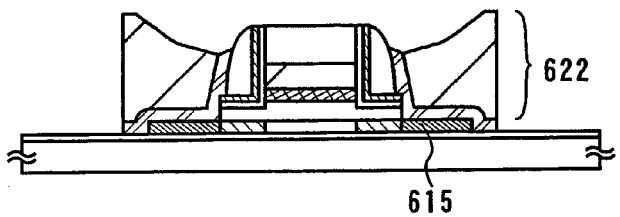

Next, as shown in FIG. 4C, a divided conductive film 621 is etched, and a source and drain electrode 622 is formed. In the etching, the source and drain region 615 of the crystalline silicon film is etched, thereby forming a thin film transistor that occupies a smaller area. FIG. 4E shows the TFT of this case. In the TFT, an edge of a source and drain region 631 that is etched is lined up with an edge of a source and drain electrode 632. As a result, it is possible to mount more TFTs per unit area of one substrate, and thus, high integration is possible.

Figure 4D:
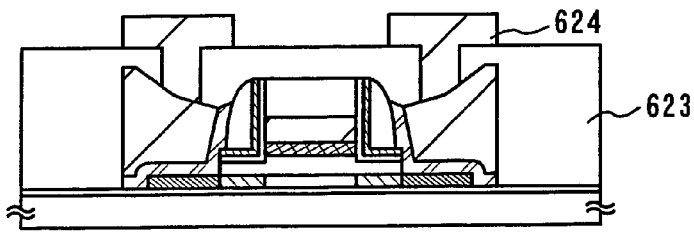
Figure 4E:
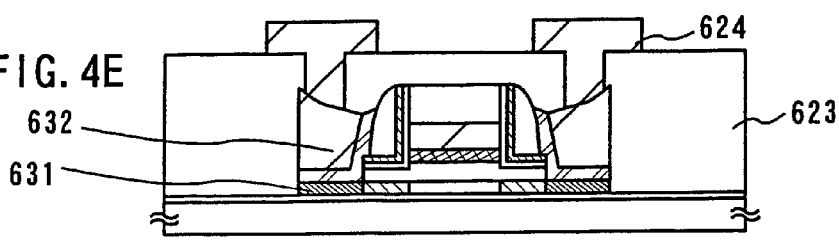

Next, a sixth insulating film is formed over the substrate, as shown in FIG. 4D, which serves as an interlayer insulating film 623. In this embodiment, a silicon nitride oxide film is formed as the interlayer insulating film. Then, a contact hole is formed to connect with the source and drain electrode 622 and then, a fifth conductive film to be a connection wiring is formed. Thereafter, a resist mask having a desired pattern is formed over the fifth conductive film, and the conductive film is etched into a desired pattern by using the mask to form a connection wiring 624.

Note that the manufacturing steps of embodiment mode 2 can be also adapted, although the manufacturing steps of embodiment mode 1 is employed in this embodiment.

In the TFT formed in the embodiment mode, a resist mask having a desired shape can be formed without using a photomask, and a source and drain electrode can be formed by self-alignment. Thus, in a TFT having a miniaturized structure, short-circuit of a gate electrode and a source and drain electrode due to misalignment can be prevented to manufacture a TFT with the high yield.

The area of a TFT can be reduced, since it is not necessary to expand the area of a semiconductor region in consideration of a margin so as to ensure a connection between the semiconductor region and the source and drain electrode.

Further, in a semiconductor element formed in the present invention, the gate electrode and the source and drain electrode are formed with an insulating film 612 covering the gate electrode therebetween. Namely, it is possible to closely form the channel forming region and the source and drain electrode that are formed under the gate electrode, and thus, to reduce the resistance therebetween. Therefore, a TFT that can operate with high-speed can be manufactured.

A semiconductor device such as a scanning line driver circuit, a signal line driver circuit, a controller, a CPU, or a converter of an audio processing circuit in a pixel portion can be manufactured according to this embodiment. A system-on-panel that is small and that can display high-definition images can be manufactured by providing a liquid crystal display device or an EL (electroluminescence) display device for the pixel portion by a known technique, in addition to forming a system (function circuit).

Embodiment 2

A step of manufacturing a semiconductor element using a semiconductor substrate, according to the present invention, is described with reference to FIGS. 6A to 6E in this embodiment. Note that the semiconductor substrate is a single crystal silicon substrate or a compound semiconductor substrate, representatively, an n-type or a p-type single crystal silicon substrate, a GaAs substrate, an InP substrate, a GaN substrate, a SiC substrate or a ZnSe substrate.

Figure 6A:
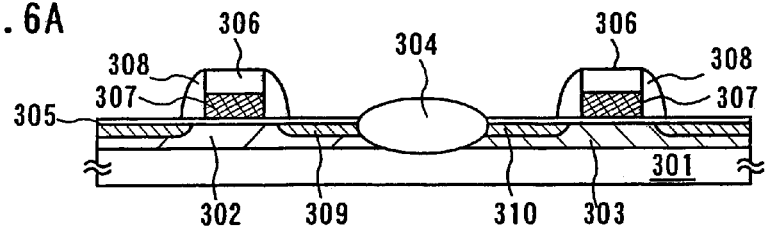
FIGS. 6A to 6E show a step of manufacturing a semiconductor element according to the present invention.

As shown in FIG. 6A, a p-type semiconductor substrate 301 made of single crystal silicon is provided, for example, a p-type well 302 and an n-type well 303 are provided for the semiconductor substrate, and then, a field insulating film 304 for separating elements, which is made of a silicon oxide film having a LOCOS (Local Oxidation of Silicon) structure, is formed by thermally oxidizing a selective region of the surface of the semiconductor substrate 301.

Next, the surface of the semiconductor substrate 301 is thermally oxidized to form a silicon oxide film (gate insulating film) 305 that is a thin film and is about 50 nm or less. And a polycrystalline silicon film of around 300 nm in thickness is deposited over the silicon oxide film 305 by CVD.

Next, a silicon oxide film of around 50 nm in thickness is formed by CVD so that a hard mask for forming a gate electrode is formed over the semiconductor substrate 301. After that, a resist is applied over the silicon oxide film and light-exposure and development are performed using a photomask to form a resist mask having a shape of the gate electrode.

The silicon oxide film is dry-etched to form a hard mask 306 using the resist mask. Then, the resist mask is removed and the polycrystalline silicon film is etched to form a gate electrode 307 by using the hard mask as a mask for the etching. Note that the polycrystalline silicon film has higher etching rate than the silicon oxide film of the gate insulating film, and thus, only the polycrystalline silicon film can be selectively etched. Alternatively, the resist mask is not removed and the gate electrode 307 may be formed by using the resist mask and the hard mask as a mask for etching.

After a silicon oxide film is deposited by CVD over the semiconductor substrate 301, the silicon oxide film is etched by a RIE method, an ECR method, or the like to form a sidewall 308.

Ion-implantation of an impurity element imparting n-type such as phosphorous is performed on the p-type well 302 over the semiconductor substrate 301 to form an n-type semiconductor region 309 to be a source and a drain. And, ion-implantation of an impurity element imparting p-type such as boron is performed on the n-type well 303 over the semiconductor substrate 301 to form a p-type semiconductor region 310 to be a source and a drain.

Figure 6B:
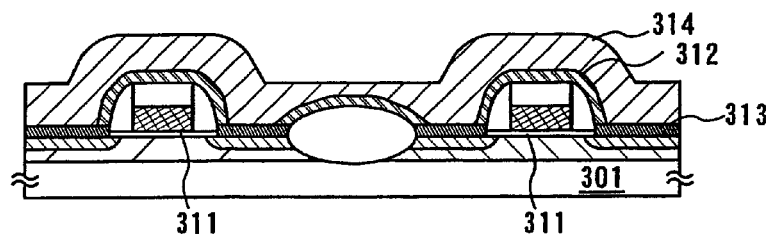

As shown in FIG. 6B, the silicon oxide film 305, which is formed over the n-type semiconductor region 309 to be a source or a drain and the p-type semiconductor region 310 to be a source and a drain, is removed to form a gate insulating film 311. Thereafter, the hard mask may be etched back to expose the gate electrode.

A high-melting point metal film such as a titanium film, a tungsten film, a molybdenum film, a cobalt film, a nickel film is formed over the semiconductor substrate 301 by sputtering. In this embodiment, a titanium film 312 is formed, and then, a silicon high-melting point metal film 313 is formed by a heat treatment in a region where the high-melting point metal film is in contact with a silicon region. After that, a conductive film, for example, an aluminum film 314 is formed by sputtering. At this time, the gate electrode and the like are formed over the semiconductor substrate, and thus, the surface of the aluminum film is convex and concave.

Figure 6C:
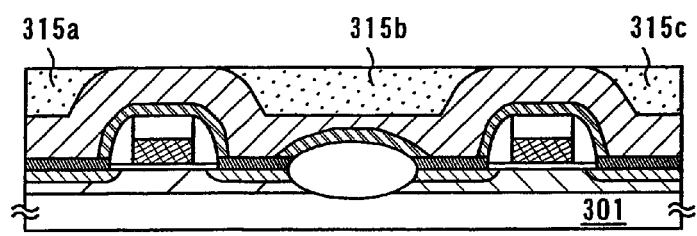

A resist is applied to the semiconductor substrate 301. At the time, the resist has a thin film thickness over the gate electrode and a relatively thick film thickness in other regions. Then, the entire face of the resist is exposed to light as in Embodiment Mode 1, and then, is developed to form resist masks 315a, 315b, and 315c (FIG. 6C).

Figure 6D:
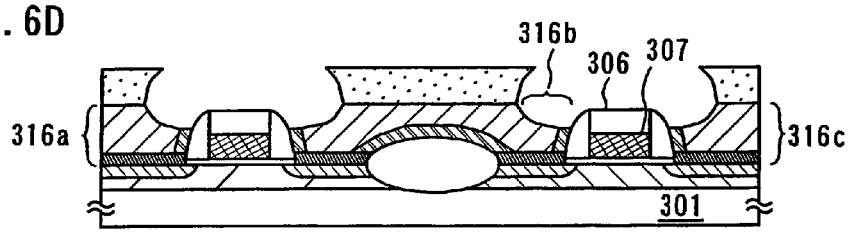

As shown in FIG. 6D, the aluminum film and the titanium film are wet-etched by using the resist masks 315a, 315b, and 315c as etching masks to remove the aluminum film and the titanium film over the gate electrode, thereby forming an aluminum film and a titanium film 316a, 316b, and 316c that each are separated. It should be noted that the gate electrode is not etched, since the hard mask serves as an etching stopper due to the difference in etching rate, in the case where the hard mask 306 is formed over the gate electrode 307.

Figure 6E:
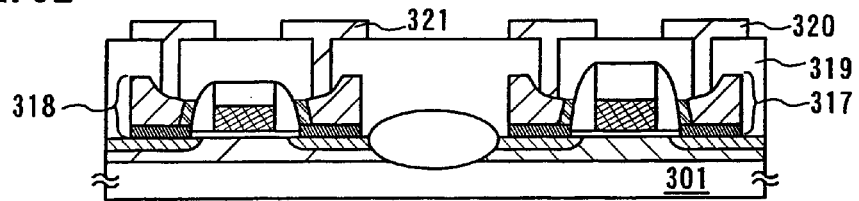
Figure 7A:
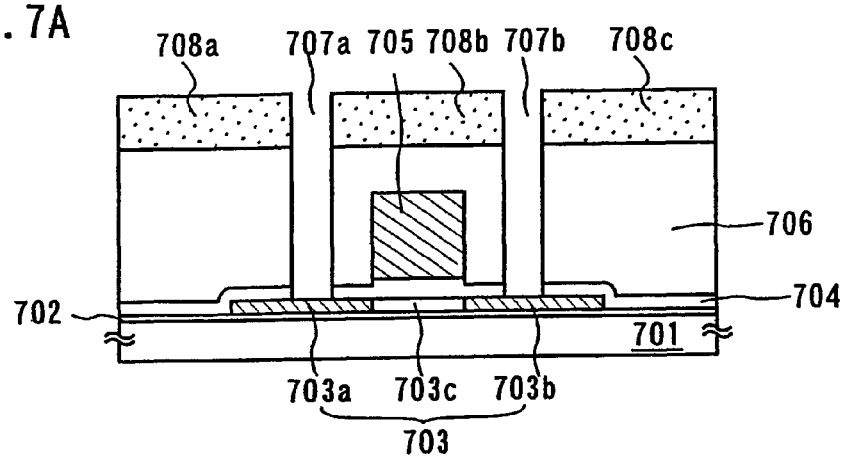
FIGS. 7A to 7C show a step of manufacturing a conventional semiconductor element.
Figure 7B:
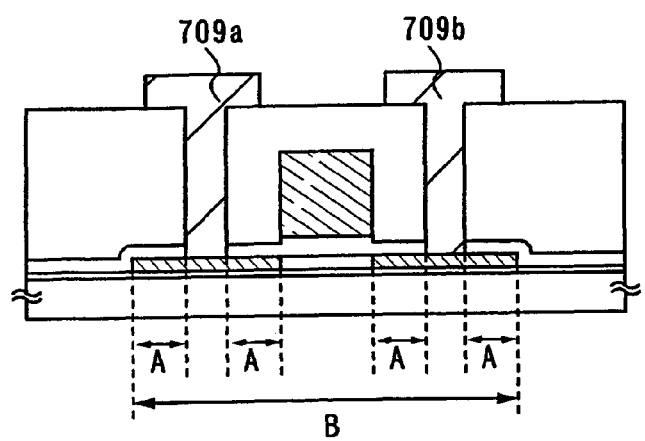
Figure 7C:
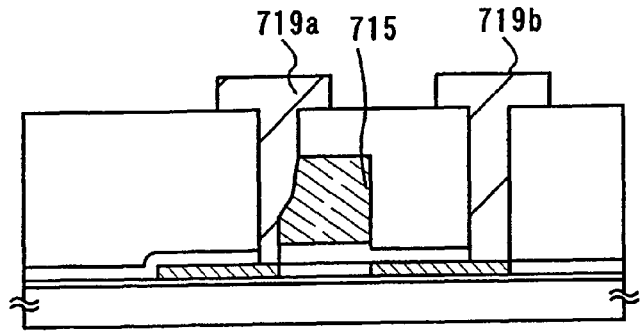

As shown in FIG. 6E, source and drain electrodes 317 and 318 of each element are formed. An insulating film is formed and then, an interlayer insulating film 319 is formed by leveling the insulating film. After that, a contact hole is formed to connect with the source and drain electrodes 317 and 318, and a conductive film to be a connection wiring is formed. Thereafter, a resist mask having a desired pattern is formed over the conductive film, and the conductive film is etched into a desired shape by using the mask to form connection wirings 320 and 321. In this embodiment, an aluminum film is formed as the conductive film. Note that the leveling step is not needed in the case where an $SiO_x$ film, a PSG (phosphorous silicate glass) film, a BSG (boron silicate glass) film, or a SOG (Spin On Glass) of a BPSG (boron phosphorous silicate glass) film, which are each formed by spin-coating, is used for the interlayer insulating film 319. However, in this case, since a heat treatment step is necessary, a film made of a high-melting point metal such as tungsten, titanium, molybdenum, cobalt, or nickel is formed for the source and drain electrodes 317 and 318.

Note that the manufacturing step of embodiment mode 2 can be also employed, although the manufacturing step of embodiment mode 1 is employed in this embodiment.

In the MOSFET formed in the embodiment mode, a resist mask having a desired shape can be formed without using a photomask, and a source and drain electrode can be formed by self-alignment. Thus, in a MOSFET having a miniaturized structure, short-circuit of a gate electrode and a source and drain electrode due to misalignment can be prevented to manufacture a MOSFET with the high yield.

The area of a MOSFET can be reduced, since it is not necessary to expand the space of a semiconductor element in consideration of a margin so as to ensure a connection between the semiconductor region and the source and drain electrode.

Further, in a semiconductor element formed according to the present invention, a gate electrode and a source and drain electrode are formed with a sidewall 308 therebetween. Namely, it is possible to closely form a source electrode and a drain electrode that are formed under the gate electrode, and thus, to reduce the resistance therebetween. Therefore, a MOSFET that can operate with high-speed can be manufactured.

According to this embodiment, it is possible to manufacture a semiconductor device such as a scanning line driver circuit, a signal line driver circuit, a controller, a CPU, a converter of an audio processing circuit, a power supply circuit, a transmit and receive circuit, a memory, or an amplifier of an audio processing circuit in a pixel portion in which the integration degree is enhanced. Further, a system-on-chip can be manufactured, in which circuits such as an MPU (microcomputer), a memory, and an I/O interface constituting a system (function circuit) are mounted on one chip in monolithic, and which can realize high speed, high reliability, and low electrical power consumption.

Embodiment 3

Figure 8:
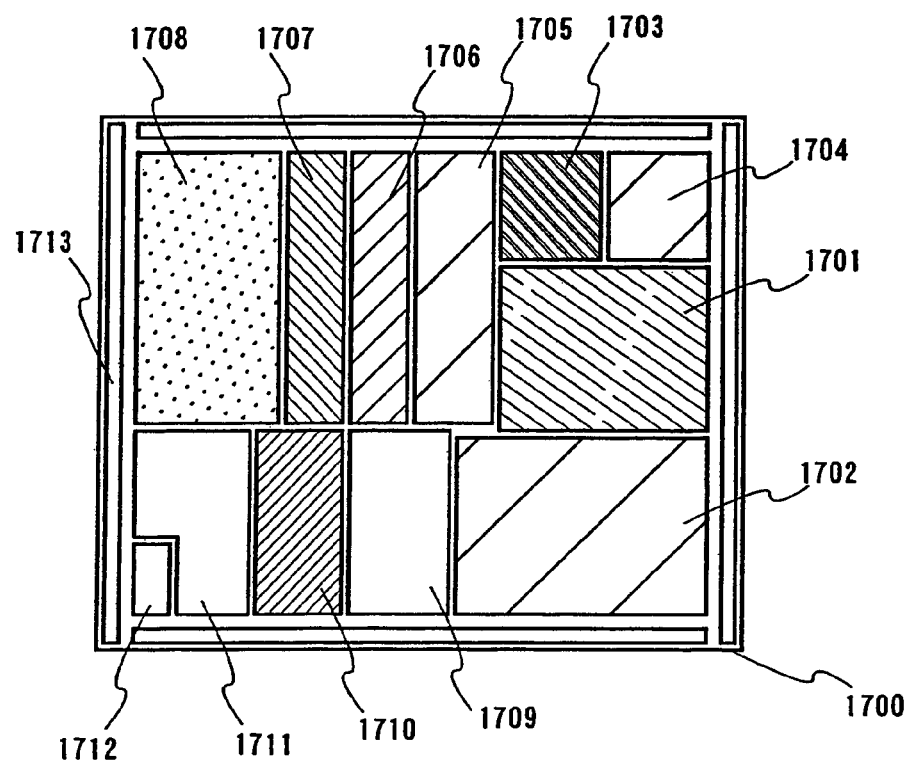
FIG. 8 shows a semiconductor device according to the present invention.

One example of a system-on-chip that is a representative semiconductor element manufactured according to Embodiment Modes 1 and 2 is described with reference to FIG. 8. As shown in FIG. 8, various kinds of function circuit portions are integrated on a single crystal silicon substrate, thereby realizing a system-on-chip. Various kinds of function circuit portions can be formed by mainly using a semiconductor element such as MOSFET or a capacitor portion manufactured according to Embodiment Mode 1 or 2. Note that a semiconductor device like one in this embodiment can be formed by using a semiconductor element such a TFT or a capacitor element manufactured according to Embodiment Mode 1 or 2, by using a substrate having an insulating surface (typically, a glass substrate) as the substrate.

A CPU 1701, a ROM 1702, an interrupt controller 1703, a cache memory 1704, a RAM 1705, a DMAC 1706, a clock generation circuit 1707, a serial interface 1708, a power supply generation circuit 1709, a ADC/DAC 1710, a timer counter 1711, a WDT 1712, an I/O port 1713 and the like are shown as elements of a system-on-chip 1700 shown in FIG. 8.

A semiconductor device such as MPU (a microcomputer), a media processor, a graphics LSI, a cryptogram LSI, a memory, a portable telephone LSI can be manufactured by exchanging a combination or structure of various functional circuits for a system-on-chip.

As for a semiconductor element manufactured according to the present invention, a source electrode and a drain electrode can be formed by self-alignment without using a photomask. Thus, in a miniaturized structure, short-circuit of a gate electrode and a source and drain electrode due to alignment accuracy, accuracy of processing technique by reduced projection exposure, a finished dimension of a resist mask, or an etching technique, can be prevented to manufacture a semiconductor element with the high yield.

It is not necessary to expand the area of a semiconductor region in consideration of a margin so as to ensure a connection between the semiconductor region and the source and drain electrode of the semiconductor element, thereby enhancing the integration degree of a semiconductor device as well as forming a miniaturized semiconductor element.

Further, in a semiconductor element formed according to the present invention, a gate electrode and a source and drain electrode are formed with an insulating film covering the gate electrode therebetween. Namely, it is possible to closely form a channel forming region and a source and drain electrode that are formed under the gate electrode, and thus, to reduce the resistance therebetween. Therefore, a semiconductor element and a semiconductor device that can operate with high-speed can be manufactured.

This application is based on Japanese Patent Application serial no. 2003-118731 filed in Japan Patent Office on 23 Apr. 2003, the contents of which are hereby incorporated by reference.

Although the present invention has been fully described by way of Embodiment Modes and Embodiments with reference to the accompanying drawings, it is to be understood that various changes and modifications will be apparent to those skilled in the art. Therefore, unless otherwise such changes and modifications depart from the scope of the present invention hereinafter defined, they should be constructed as being included therein.

What is claimed is:

1. A method for manufacturing a semiconductor device comprising steps of:
   forming a first insulating film over a semiconductor region;
   forming a gate electrode over the semiconductor region with the first insulating film interposed therebetween;
   forming a second insulating film over the gate electrode;
   forming a sidewall covering a side face of the gate electrode with the second insulating film interposed therebetween;
   etching a portion of the second insulating film by using the sidewall as a mask;
   forming a first conductive film covering the gate electrode, the sidewall and the semiconductor region;
   forming a second conductive film over the first conductive film;
   forming a resist mask over the second conductive film;
   etching portions of the second conductive film and the first conductive film to expose at least a portion of the sidewall by using the resist mask;
   etching the etched second conductive film to form at least one of a source and drain electrodes,
   wherein the at least one of the source and drain electrodes is electrically connected to the semiconductor region with the first conductive film interposed therebetween.

2. The method according to claim 1, wherein the first conductive film comprises tantalum nitride.

3. The method according to claim 1, wherein the second insulating film comprises silicon oxynitride or silicon nitride.

4. The method according to claim 1, wherein the resist mask is formed by forming a resist over the second conductive film and removing an entire upper portion of the resist to expose an upper surface of the second conductive film.

5. The method according to claim 1, further comprising steps of:
   forming an interlayer insulating film over the at least one of the source and drain electrodes; and
   forming a wiring electrically connected to the at least one of the source and drain electrodes through the interlayer insulating film.

6. The method according to claim 1, wherein the semiconductor region is formed by using a SOI (Silicon On Insulator) substrate.

7. The method according to claim 1, wherein the semiconductor region is formed by using a single crystal silicon substrate.

8. A method for manufacturing a semiconductor device comprising steps of:
- forming an insulating film over a semiconductor region;
- forming a gate electrode over the semiconductor region with the insulating film interposed therebetween;
- forming a sidewall covering a side face of the gate electrode;
- forming a metal film over the gate electrode, the sidewall and the semiconductor region;
- forming a metal silicide film in a region where the metal film is in contact with the semiconductor region;
- forming a conductive film over the metal film and the metal silicide film;
- forming a resist mask over the conductive film;
- etching portions of the conductive film and the metal film to expose a portion of the sidewall by using the resist mask; and
- etching the etched conductive film to form at least one of a source and drain electrodes, wherein the at least one of the source and drain electrodes is electrically connected to the semiconductor region with the metal silicide film interposed therebetween.

9. The method according to claim 8, wherein the resist mask is formed by forming a resist over the conductive film and removing an entire upper portion of the resist to expose an upper surface of the conductive film.

10. The method according to claim 8, further comprising steps of:
- forming an interlayer insulating film over the at least one of the source and drain electrodes; and
- forming a wiring electrically connected to the at least one of the source and drain electrodes through the interlayer insulating film.

11. The method according to claim 8, wherein the semiconductor region is formed by using a SOI (Silicon On Insulator) substrate.

12. The method according to claim 8, wherein the semiconductor region is formed by using a single crystal silicon substrate.

13. The method according to claim 8, wherein the metal film comprises at least one of the group consisting of titanium, tungsten, molybdenum, cobalt, and nickel.

14. The method according to claim 8, wherein the semiconductor region comprises silicon.

15. A method for manufacturing a semiconductor device comprising steps of:
- oxidizing a part of a surface of a semiconductor region to form a field insulating film;
- forming a first insulating film over the semiconductor region;
- forming a gate electrode over the semiconductor region with the first insulating film interposed therebetween;
- forming a second insulating film over the gate electrode;
- forming a sidewall covering a side face of the gate electrode with the second insulating film interposed therebetween;
- etching a portion of the second insulating film by using the sidewall as a mask;
- forming a first conductive film covering the gate electrode, the sidewall and the semiconductor region;
- forming a second conductive film over the first conductive film;
- forming a resist mask over the second conductive film;
- etching portions of the second conductive film and the first conductive film to expose at least a portion of the sidewall by using the resist mask;
- etching the etched first and second conductive films to divide a portion of the etched first and second conductive film over the field insulating film so that at least one of a source and drain electrodes is formed,
- wherein the at least one of the source and drain electrodes is electrically connected to the semiconductor region with the first conductive film interposed therebetween, and
- wherein the one of the source and drain electrodes is isolated from one of the source and drain electrodes of another semiconductor device.

16. The method according to claim 15, wherein the substrate comprises silicon.

* * * * *